US010327367B2

(12) United States Patent
Yamamoto (10) Patent No.: US 10,327,367 B2
(45) Date of Patent: Jun. 18, 2019

(54) WORKING APPARATUS AND WORKING METHOD

(71) Applicant: Panasonic Intellectual Property Management Co., Ltd., Osaka (JP)

(72) Inventor: Minoru Yamamoto, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 315 days.

(21) Appl. No.: 15/355,547

(22) Filed: Nov. 18, 2016

(65) Prior Publication Data

US 2017/0181341 A1 Jun. 22, 2017

(30) Foreign Application Priority Data

Dec. 17, 2015 (JP) ................. 2015-245859

(51) Int. Cl.
*H05K 13/04* (2006.01)
*H05K 13/02* (2006.01)
*H05K 3/30* (2006.01)

(52) U.S. Cl.
CPC ......... *H05K 13/0413* (2013.01); *H05K 3/303* (2013.01); *H05K 13/0406* (2018.08);
(Continued)

(58) Field of Classification Search
CPC .... H05K 3/303; H05K 3/306; H05K 13/0015; H05K 13/0404; H05K 13/04069; H05K 13/0408; H05K 13/0409; H05K 13/0413; H05K 13/046; H05K 13/0813; Y10T 29/4913; Y10T 29/49131; Y10T 29/49133;
(Continued)

(56) References Cited

U.S. PATENT DOCUMENTS 5,657,533 A * 8/1997 Fukui ................. H05K 13/0413
29/740
5,697,658 A * 12/1997 Park ....................... B65G 47/91
29/743
7,568,284 B2 * 8/2009 Kadota .............. H05K 13/0404
29/741

FOREIGN PATENT DOCUMENTS

JP    S58-137591 A    8/1983
JP    H02-059248 A    2/1990
(Continued)

*Primary Examiner* — Peter Dungba Vo
*Assistant Examiner* — Joshua D Anderson
(74) *Attorney, Agent, or Firm* — Pearne & Gordon LLP (57) ABSTRACT

A working apparatus includes a component holder that holds a component and mounts the component at a predetermined position of a work. In the working apparatus, the component holder that holds a component is configured to include a pair of grip members that pinch and grip the component, a grip member opening/closing portion that opens and closes the pair of grip members with an opening/closing motor as a drive source, a pair of contact portions that are disposed on the pair of grip members and freely rotate around a rotary shaft provided in an opening/closing direction of the grip member, and a contact portion driving portion that causes a roller, which is provided to be in contact with a side of a nozzle shaft, to convert a lifting and lowering motion of a nozzle shaft into a rotational motion of a spline shaft, and that causes the rotational motion to be transmitted to the contact portion via a plurality of rollers such that the contact portion rotates around the rotary shaft.

9 Claims, 9 Drawing Sheets

(52) U.S. Cl.
CPC ..... *H05K 13/0408* (2013.01); *H05K 13/0409* (2018.08); *Y10T 29/49133* (2015.01); *Y10T 29/53174* (2015.01); *Y10T 29/53183* (2015.01); *Y10T 29/53191* (2015.01)

(58) Field of Classification Search
CPC ......... Y10T 29/49139; Y10T 29/53174; Y10T 29/53178; Y10T 29/53183; Y10T 29/53191
See application file for complete search history.

(56) References Cited

FOREIGN PATENT DOCUMENTS

| | | |
|---|---|---|
| JP | H06-283894 A | 10/1994 |
| JP | 2000-036695 A | 2/2000 |
| JP | 2008-023641 | 2/2008 |
| JP | 2011-258875 A | 12/2011 |
| JP | 2012-134341 A | 7/2012 |
| JP | 2015-077653 A | 4/2015 |

* cited by examiner

WORKING APPARATUS AND WORKING METHOD

BACKGROUND

1. Technical Field

The present disclosure relates to a working apparatus and a working method in which a component is held by a component holder and is mounted at a predetermined position of a work.

2. Description of the Related Art

In a component mounting line in which a component is mounted on a work such as a board, various types of components are mounted on the work by a component mounting apparatus. Examples of the component include, in addition to a surface mounting component, such as a chip type component or a QFP, which is soldered and bonded on an electrode plane of a circuit board, an insertion component, such as a power transistor or a connector component, which has a connecting lead and is mounted with the lead being inserted into a mounting hole formed in a circuit board. In such a component mounting apparatus of the insertion component, a supply method varies depending on a type of component and a supply posture of the component varies depending on the type of component. In a case where the insertion component is supplied in a prone posture, there is a need to convert the posture of the insertion component to an upright posture before the component is mounted on the board. Therefore, there has been proposed a component inserter, which has a function of converting the prone posture of the insertion component into the upright posture (for example, see PTL 1).

In the example of the related art disclosed in PTL 1, a component holder (component holding hand), which holds a component, is configured of a link mechanism including two arms that pinch and grip a component and a suction unit that sucks the component, and the component holder handles the component such that a posture of the component picked up from a component supplier is converted from the prone posture to the upright posture.

CITATION LIST

Patent Literature

PTL 1: Japanese Patent Unexamined Publication No. 2008-23641

SUMMARY

According to an aspect of the disclosure, there is provided a working apparatus including: a component holder that holds a component and mounts the component at a predetermined position of a work. The component holder includes a pair of grip members, a grip member opening/closing portion that opens and closes the pair of grip members, a pair of contact portions that are disposed on the pair of grip members and freely rotate around a rotary shaft provided in an opening/closing direction of the grip member, and a contact portion driving portion that causes the contact portion to rotate around the rotary shaft.

According to another aspect of the disclosure, there is provided a working method in which a component holder holds a component and mounts the component at a predetermined position of a work. The working method includes: causing a pair of grip members to be in an opening state; picking up the component from a supplier and positioning the component between contact portions provided in the pair of grip members; pinching and holding the component by the contact portions; causing the contact portion to rotate with respect to the grip member and converting a posture of the component; and mounting the component at the predetermined position of the work.

According to still another aspect of the disclosure, there is provided a working method in which a component holder holds a component and mounts the component at a predetermined position of a work. The working method includes: picking up the component from a supplier; pinching and holding the component picked up by contact portions provided in a pair of grip members; causing the contact portion to rotate with respect to the grip member and converting a posture of the component; and mounting the component at the predetermined position of the work.

According to the disclosure, it is possible to convert a posture of a component by a component holder and to efficiently mount the component on a work.

DETAILED DESCRIPTIONS

Before an exemplary embodiment of the disclosure is described, a problem in the related art is briefly described. In the example of the related art described above, the following problems arise due to the configuration of the component holder. In other words, in order to cause the link mechanism, which is used in the component holder, to have a handling function of converting a posture of the component or the like, there is a need to employ a complicated mechanism such as a multi-joint drive mechanism. Therefore, it is difficult to simply configure the component holder in a small size, and it is difficult to apply the component holder to a component mounting field in which reduction in size is demanded. Thus, the problem is not limited to only the insertion component having a lead that is inserted into an insertion hole of a board, but also a plurality of common components in which a posture of a component needs to be converted in a series of mounting operations from the picking-up of the component from a component supplier to the mounting to the work.

Then, an object of the disclosure is to provide a working apparatus and a working method in which a component holder converts a posture of a component and efficiently mounts the component to the work.

Figure 1:
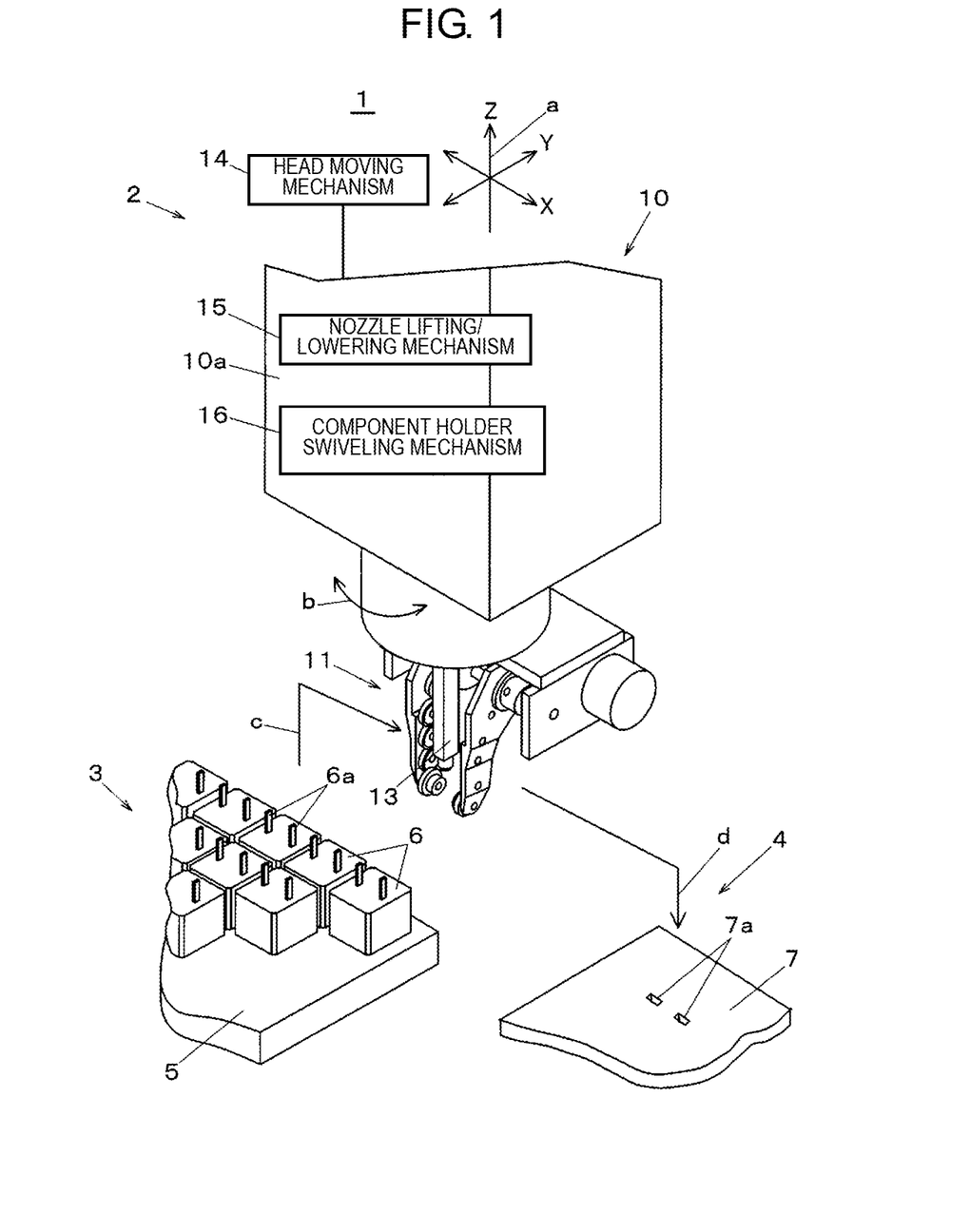
FIG. 1 is a perspective view illustrating a configuration of a working apparatus according to an exemplary embodiment of the disclosure.

Hereinafter, the exemplary embodiment of the disclosure will be described with reference to figures. First, an entire configuration of working apparatus 1 will be described with reference to FIG. 1. As illustrated in FIG. 1, working apparatus 1 picks up and holds component 6 from supplier 3 by component mounting mechanism 2, and has a function of mounting component 6 on board 7 as the work positioned on board holder 4.

Component mounting mechanism 2 is configured to cause working head 10, below which component holder 11 that holds component 6 is provided, to move by head moving mechanism 14 in X, Y, and Z directions (refer to arrow a). Component holder 11 swivels in a θ direction (arrow b) by component holder swiveling mechanism 16 built in head main body 10a, and further includes nozzle shaft 13 that is lifted and lowered by nozzle lifting/lowering mechanism 15 built in working head 10. Nozzle shaft 13 sucks component 6 by nozzle 13a (refer to FIG. 2) provided in a lower end portion, and has a function of pushing component 6 to board 7 when component 6 held by component holder 11 is mounted on board 7.

In the component mounting work by component mounting mechanism 2, working head 10 is caused to move to supplier 3 on which component 6 having a posture, in which lead 6a faces upward on component tray 5, is positioned, and component holder 11 picks up and holds component 6 (arrow c). Subsequently, after component holder 11 converts the posture of component 6 such that lead 6a faces downward, working head 10 is caused to move to board holder 4 on which board 7 is positioned after an image recognizing device (refer to component recognition camera 50 illustrated in FIGS. 9A to 9E) recognizes component 6 from the underside. Component 6 is lowered (arrow d) together with component holder 11, lead 6a is inserted into mounting hole 7a formed in board 7, and thereby component 6 is mounted on board 7.

Figure 2:
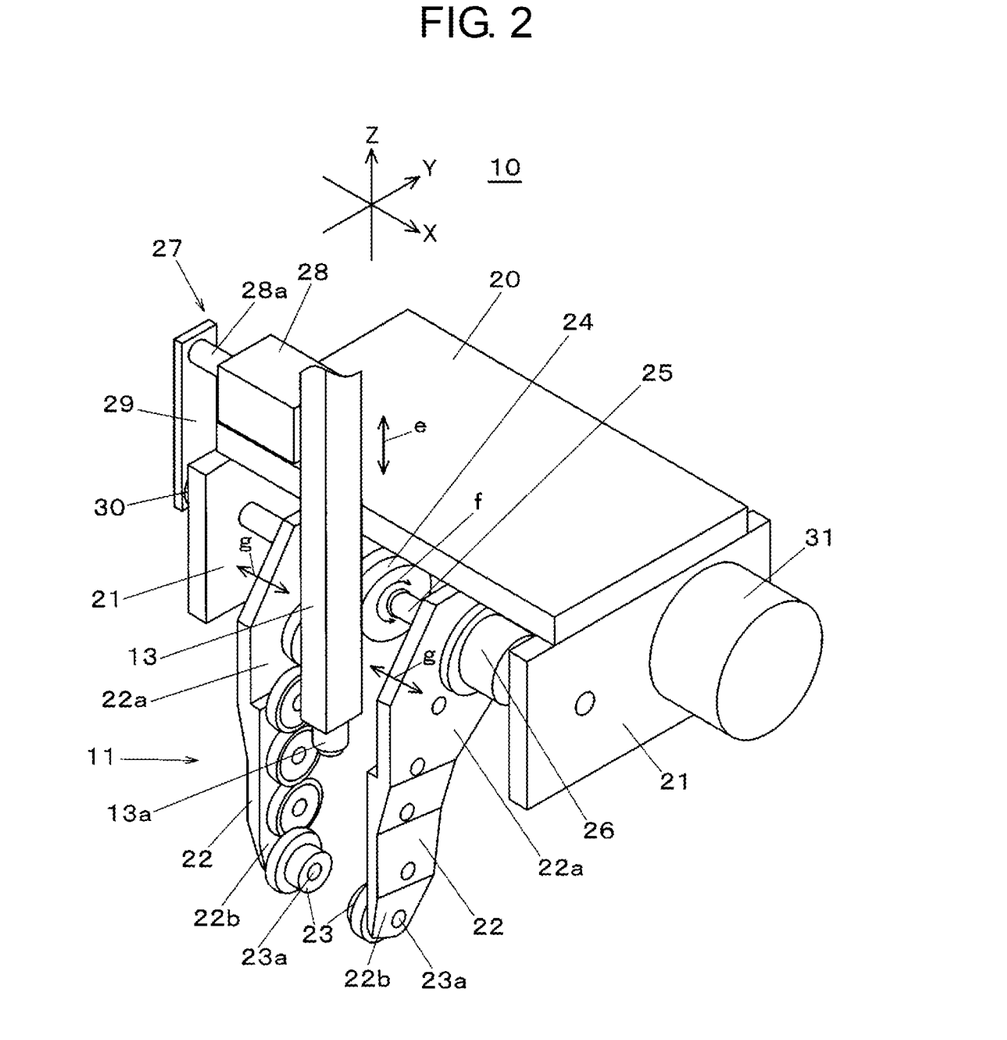
FIG. 2 is a perspective view illustrating a configuration of a component holder (first example) in a working head that is used in the working apparatus of the exemplary embodiment of the disclosure.
Figure 3:
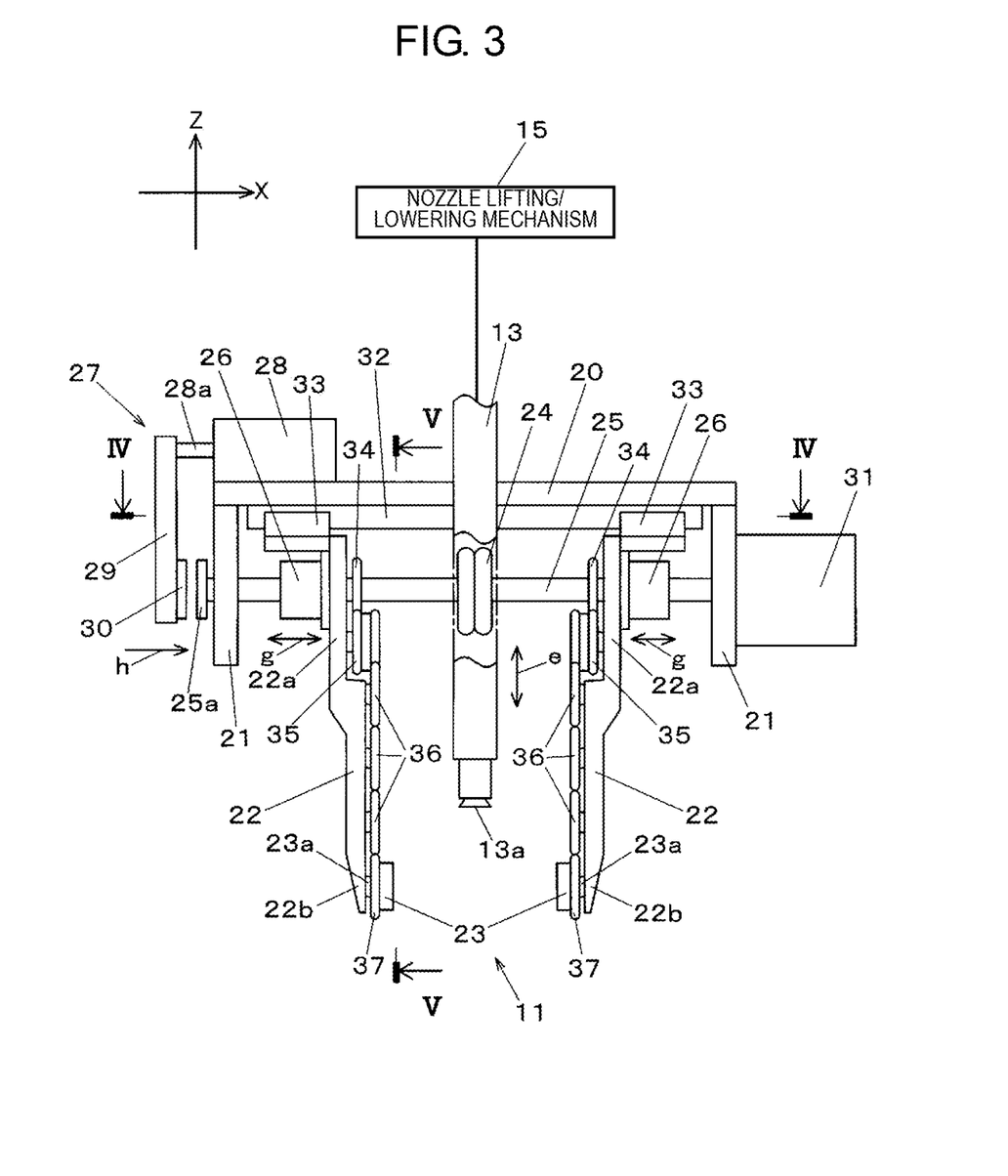
FIG. 3 is a view depicting a configuration of the component holder (first example) in the working head that is used in the working apparatus of the exemplary embodiment of the disclosure.

Next, a configuration (first example) of component holder 11 provided in working head 10 will be descried with reference to FIGS. 2 and 3. Component holder 11 has a function of gripping and holding component 6 by one pair of grip members 22. In FIGS. 2 and 3, a pair of side plates 21 are provided to project downward from end portions of horizontal connection member 20 on both sides. End portions of spline shaft 25 on both sides are supported by side plates 21, and spline shaft 25 has a horizontal posture and has an outer circumferential surface in which a groove is formed in an axial direction. Roller 24 is fixed at the central portion of spline shaft 25 so as to rotate to be integrated to spline shaft 25, and further a pair of spline bearings 26, in which spline shaft 25 is fitted, are provided on both outer sides of roller 24 in a state in which the spline bearing is allowed to slide in the axial direction.

Grip member 22 has a shape of having front end portion 22b extending downward from base portion 22a as an upper portion. Spline bearings 26 are fixed to base portions 22a of grip members 22, respectively, and the pair of grip members 22 and spline bearings 26 freely slide with respect to each other in an opening/closing direction (refer to arrow g illustrated in FIG. 2). Contact portion 23 is provided in front end portion 22b so as to freely rotate around rotary shaft 23a provided in the opening/closing direction of grip member 22. In other words, contact portion 23 is mounted on the front end portion 22b so as to freely rotate.

As illustrated in FIG. 3, linear guide 32 is disposed in the underside of connection member 20 in an X direction, and base 22a of grip member 22 is joined to slider 33 fitted to freely slide in the X direction to linear guide 32. The sliding movement of grip member 22 in the X direction is guided by a sliding guide mechanism configured of linear guide 32 and slider 33.

Figure 4:
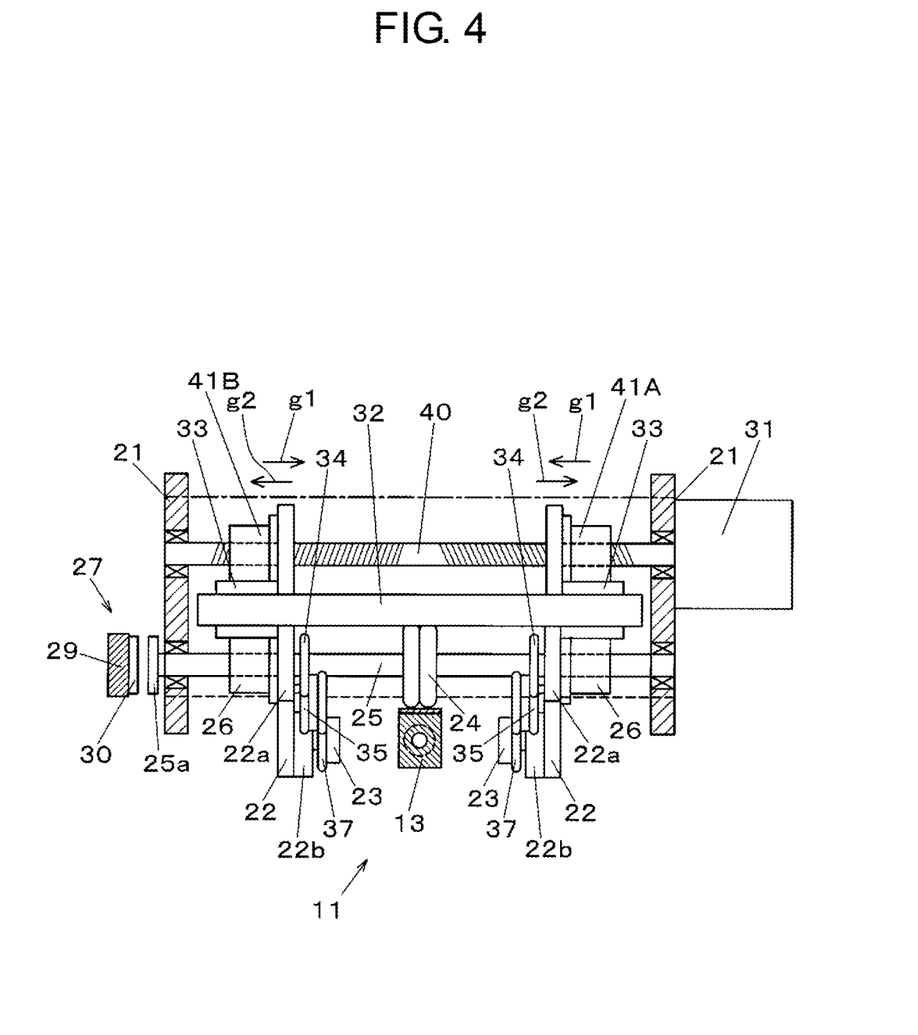
FIG. 4 is a sectional view of a part of the component holder (first example) in the working head that is used in the working apparatus of the exemplary embodiment of the disclosure.

In FIG. 4 illustrating a section taken along line IV-IV in FIG. 3, opening/closing motor 31 is disposed on a side of side plate 21 on one side. Opening/closing motor 31 drives and rotates opening/closing feed screw 40 having both end portions supported in side plates 21. Opening/closing feed screw 40 is a feed screw for an opening/closing mechanism in which feed threaded portions are formed at pitches in opposite directions on both sides with the central portion interposed therebetween in one feed screw. Nut member 41A fitted into one feed threaded portion at the pitches in opening/closing feed screw 40 is joined to one grip member 22, and nut member 41B fitted into the other feed threaded portion at the pitches is joined to the other grip member 22.

Forward and reverse drive of opening/closing motor 31 causes nut members 41A and 41B to move in a direction (arrow g1) in which a gap between the pair of grip members 22 is narrowed and in a direction (arrow g2) in which the gap is widened. Thus, it is possible to open and close the pair of grip members 22 so as to have any gap. Hence, opening/closing motor 31, opening/closing feed screw 40, and nut members 41A and 41B form a grip member opening/closing portion that opens and closes the pair of grip members 22 in X direction.

Nozzle shaft 13, which is driven to be lifted and lowered by nozzle lifting/lowering mechanism 15, is positioned between the pair of grip members 22 and is lifted and lowered between the pair of grip members 22. Roller 24, in which spline shaft 25 is fitted, is in contact with the side of nozzle shaft 13 (also refer to FIGS. 1 and 4). When nozzle lifting/lowering mechanism 15 is driven to lift and lower nozzle shaft 13 (arrow e), a rotational drive force is transmitted to roller 24 that is in contact with nozzle shaft 13 (arrow f). Thus, spline shaft 25 rotates in response to a lifting/lowering movement direction and an amount of lifting/lowering movement of nozzle shaft 13.

In the mounting work of picking up component 6 from supplier 3 and mounting the component on board 7 of board holder 4, working head 10 is caused to move to supplier 3 and nozzle shaft 13 is aligned with component 6. Nozzle shaft 13 is lowered in this state, and component 6 is sucked and held by the suction force of nozzle 13a of nozzle shaft 13. Nozzle shaft 13 is lifted in this state, and thereby component 6 sucked and held by nozzle 13a moves between the pair of grip members 22.

In other words, nozzle shaft 13 becomes a component pick-up portion that carries component 6 between the pair of grip members 22. In the exemplary embodiment, the component pick-up portion is lifted and lowered between the pair of grip members 22, and holds component 6 with the suction force by nozzle 13a. Further, in the exemplary embodiment, nozzle shaft 13 as the pick-up portion functions as a pusher that pushes, to board 7 as the work, component 6 gripped by the pair of grip members 22 (refer to FIG. 9D). In other words, working apparatus 1 in the exemplary embodiment has the pusher that pushes, to the work, component 6 gripped by the pair of grip members 22 in component holder 11.

Figure 5:
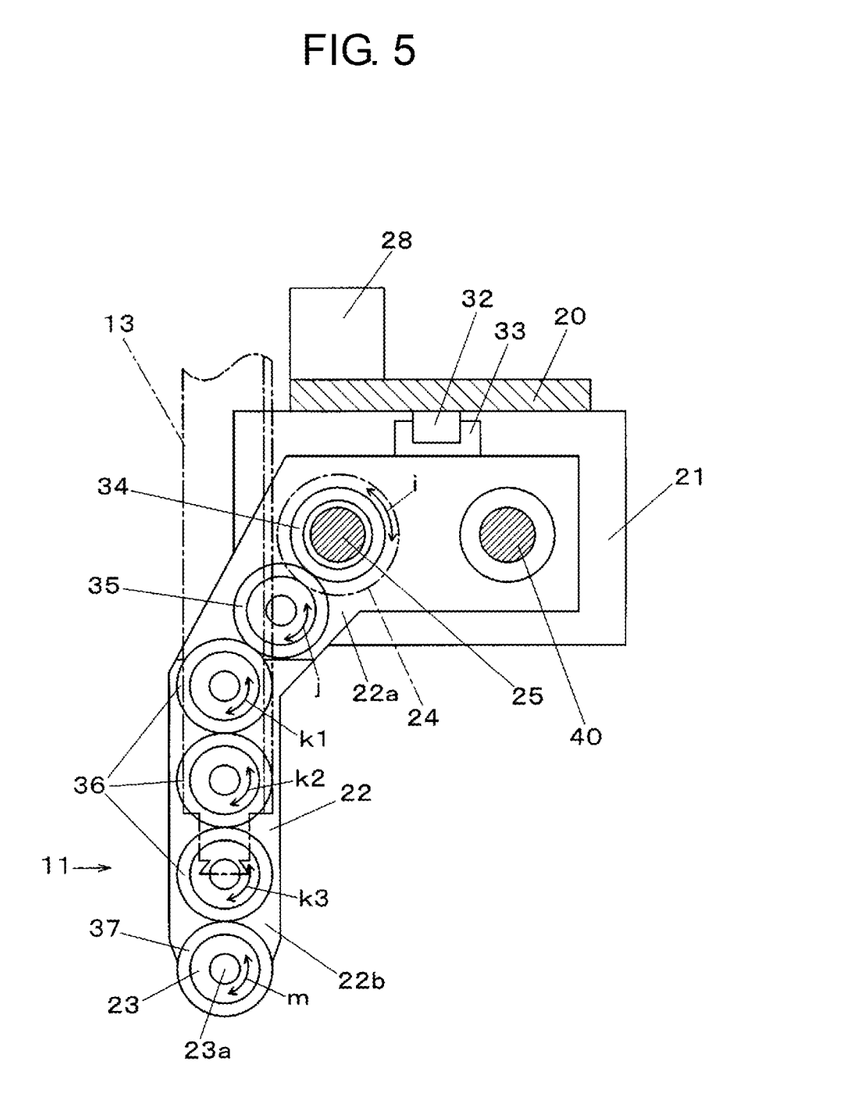
FIG. 5 is a sectional view of a part of the component holder (first example) in the working head that is used in the working apparatus of the exemplary embodiment of the disclosure.

As illustrated in FIGS. 3 and 4, drive roller 34, in which spline shaft 25 is fitted in a state in which it is possible to transmit rotation, is mounted on base 22a of each of the pair of grip members 22. In FIG. 5 illustrating a section taken along line V-V in FIG. 3, a plurality of rollers of input roller 35, three intermediate roller 36, and front end roller 37 are supported in the side of grip member 22, which is provided from base 22a to front end 22b, and front end roller 37 is joined, on the same shaft, to rotary shaft 23a of contact portion 23. Two adjacent rollers of the plurality of rollers are disposed to be in contact with an outer circumference, and an outer circumference of input roller 35 is in contact with an outer circumference of drive roller 34.

In this configuration, nozzle shaft 13 is lifted and lowered such that roller 24 is driven to rotate, thereby drive roller 34 on the same shaft rotates (arrow i), and thus input roller 35 rotates (arrow j). This rotation causes three intermediate rollers 36 to rotate in order (arrows k1, k2, and k3), further, this rotation is transmitted to front end roller 37 with which an outer circumference of lowermost intermediate roller 36 is in contact, and thereby contact portion 23 rotates around rotary shaft 23a (arrow m). In this manner, contact portion 23 disposed in front end portion 22b of grip member 22 is driven to rotate, and thereby it is possible to cause component 6 to rotate at any angle in a state in which the component is pinched by front end portion 22b, and it is possible to easily convert the posture of component 6 in the component mounting operation.

In the configuration described above, nozzle shaft 13, nozzle lifting/lowering mechanism 15, roller 24, spline shaft 25, drive roller 34, input roller 35, intermediate roller 36, and front end roller 37 configure a contact portion driving portion that causes contact portion 23 to rotate around rotary shaft 23a. Input roller 35 disposed on base 22a configures an input portion to which a rotational motion from nozzle shaft 13 and roller 24 as a power source is input via drive roller 34. Further, three intermediate rollers 36 are disposed in grip member 22 and function as a transmitter portion that transmits, to contact portion 23, the rotational motion input to input roller 35 (input portion).

Cylinder 28 is disposed on the top surface of connection member 20 at a position above an end portion of spline shaft 25 on one side and has outward rod 28a. Moving plate 29 is jointed to rod 28a and extends downward to a position facing brake plate 25a joined to an end portion of spline shaft 25. Moving plate 29 reciprocates in a horizontal direction by cylinder 28. Brake pad 30 is mounted in a lower end portion of moving plate 29 so as to face brake plate 25a, cylinder 28 operates in a direction in which rod 28a is inserted, brake pad 30 is pressed against brake plate 25a (arrow h), and thereby the rotation of spline shaft 25 is braked.

Hence, cylinder 28, moving plate 29, brake pad 30, and brake plate 25a configure brake portion 27 that brakes the rotation of spline shaft 25. A brake function of brake portion 27 is used in a case where nozzle shaft 13 is lifted and lowered in a state in which there is no need to rotate contact portion 23. In other words, in a case where there is a need to lift and lower nozzle shaft 13 while a state, in which component 6 is pinched and held by contact portion 23, is maintained, brake portion 27 is operated and spline shaft 25 is braked. Thus, nozzle shaft 13 is lifted and lowered while slippage between roller 24 and the nozzle shaft is generated.

The example described above is described as an example in which both of the pair of contact portions 23 provided on the pair of grip members 22, respectively, are driven to rotate, and both of the pair of contact portions 23 are not necessarily to be driven to rotate in the configuration of the disclosure. In other words, in order to cause contact portion 23 disposed on front end portion 22b of grip member 22 to rotate such that posture of the component is converted, only one of the two contact portions 23 that pinch the component from both sides thereof may be driven to rotate and the other contact portion 23 may be in an idling state.

Next, a configuration of component holder 11A (second example) provided in working head 10 will be described with reference to FIGS. 6 and 7. Note that FIG. 7 is a section taken along line VII-VII in FIG. 6. The second example differs from the first example in that, as the power source of the contact portion driving portion by which contact portion 23 is driven to rotate, dedicated contact portion driving motor 42 is used, and the other configurations are the same as those in the first example. In other words, in FIGS. 6 and 7, the configurational members, to which the same reference signs are assigned as those illustrated in FIGS. 3 and 4, have the same functions as those in the first example.

Figure 6:
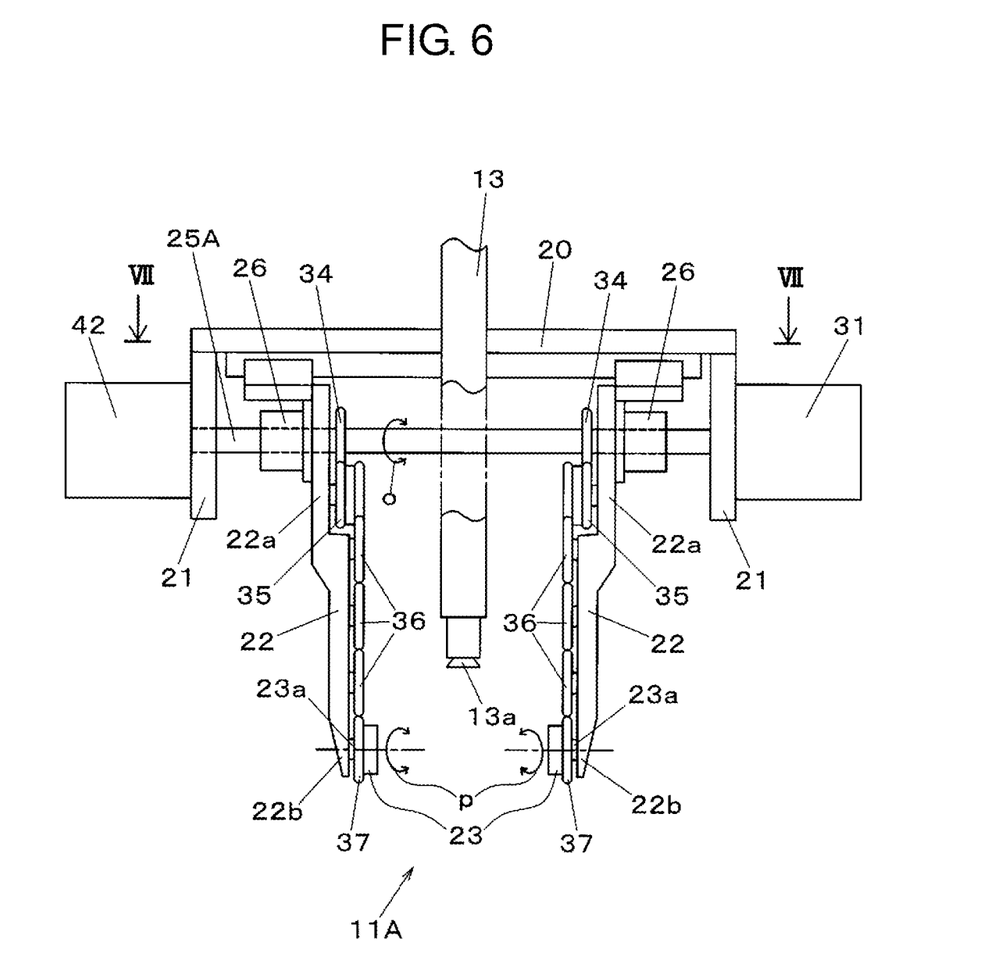
FIG. 6 is a view depicting a configuration of a component holder (second example) in the working head that is used in the working apparatus of the exemplary embodiment of the disclosure.
Figure 7:
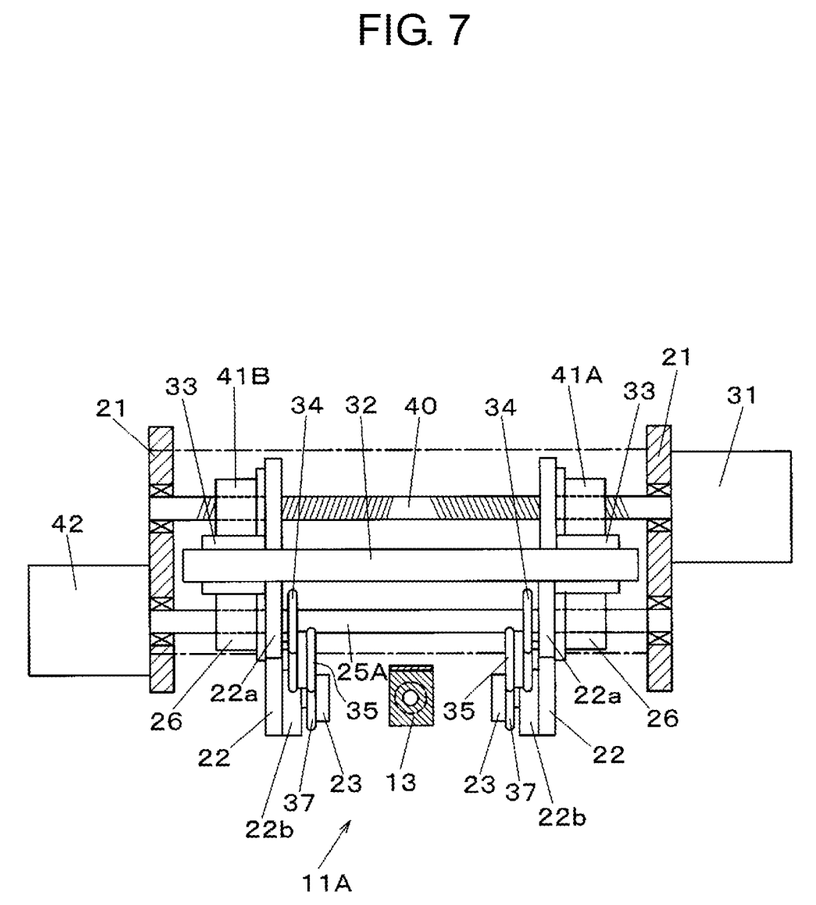
FIG. 7 is a sectional view of a part of the component holder (second example) in the working head that is used in the working apparatus of the exemplary embodiment of the disclosure.

Contact portion driving motor 42 is disposed on side plate 21 on a side opposite to side plate 21 on which opening/closing motor 31 is disposed in FIGS. 6 and 7. Contact portion driving motor 42 drives to rotate spline shaft 25A having the same functions as spline shaft 25 in the first example. Contact portion driving motor 42 as the power source is driven, thereby spline shaft 25A rotates (arrow o), and thus the rotational motion is input to input roller 35 as the input portion from the power source via drive roller 34. The rotational motion input to input roller 35 is transmitted to connection portion 23 disposed on front end portion 22b via three intermediate rollers 36 and front end roller 37 as a transmitter. Thus, similar to the configuration illustrated in the first example, contact portion 23 rotates around rotary shaft 23a (arrow p).

Working apparatus 1 described in the exemplary embodiment is configured as described above, and a working method of holding component 6 by component holder 11 in working apparatus 1 and mounting the component at a predetermined position of board 7 as the work is described with reference to FIGS. 8A to 9E.

Figure 8A:
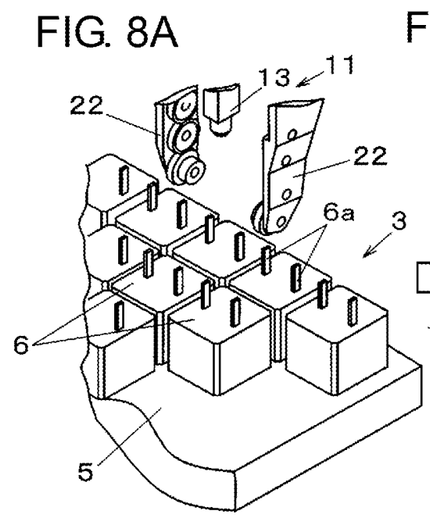
FIGS. 8A to 8F are views depicting an operation of a working method in the working apparatus of the exemplary embodiment of the disclosure.
Figure 8B:
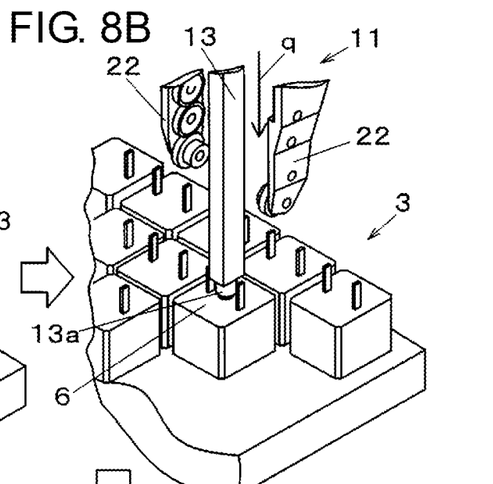

First, working head 10 illustrated in FIG. 1 is caused to move to supplier 3 on which component 6 is positioned in a posture in which lead 6a faces upward. Subsequently, as illustrated in FIG. 8A, component holder 11 is positioned above component 6 as a pick-up target and nozzle shaft 13 is aligned with component 6. At this time, the pair of grip members 22 included in component holder 11 are in a state of being opened to have a gap wider than a size of component 6 as the pick-up target. Subsequently, nozzle lifting/lowering mechanism 15 (FIGS. 1 and 3) is driven to lower nozzle shaft 13 (arrow q). As illustrated in FIG. 8B, nozzle 13a provided at the lower end of nozzle shaft 13 comes into contact with component 6 as the pick-up target, and component 6 having a posture in which lead 6a faces upward is sucked and held by nozzle 13a.

Figures 8C, 8D:
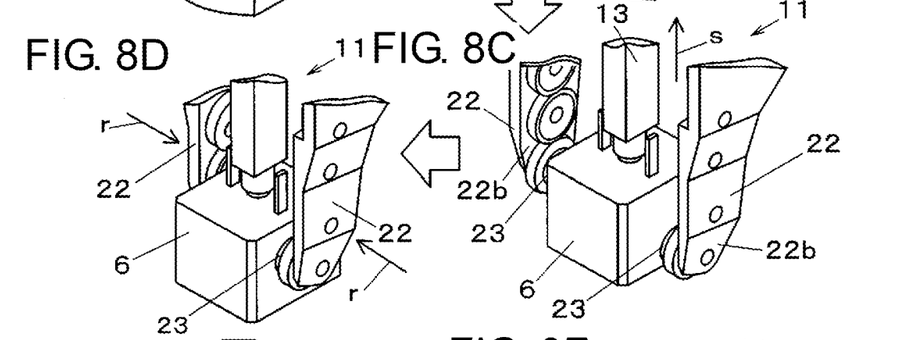

Next, as illustrated in FIG. 8C, nozzle shaft 13 is lifted to a height corresponding to front end portion 22b of grip member 22 (arrow s). Thus, component 6 of the pick-up target is positioned between contact portions 23 provided on the pair of grip members 22, respectively. In other words, component 6 is picked up from supplier 3 and is positioned between the pair of contact portions 23. Subsequently, opening/closing motor 31 is driven, and the pair of grip members 22 are caused to move in a closing direction (arrow r) by a function of the grip member opening/closing portion (FIG. 4), and then component 6 is pinched and held by contact portions 23 as illustrated in FIG. 8D.

Figure 8E:
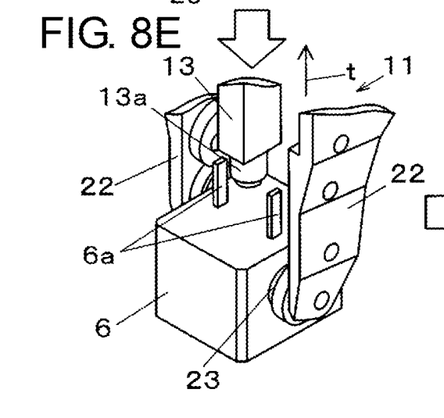
Figure 8F:
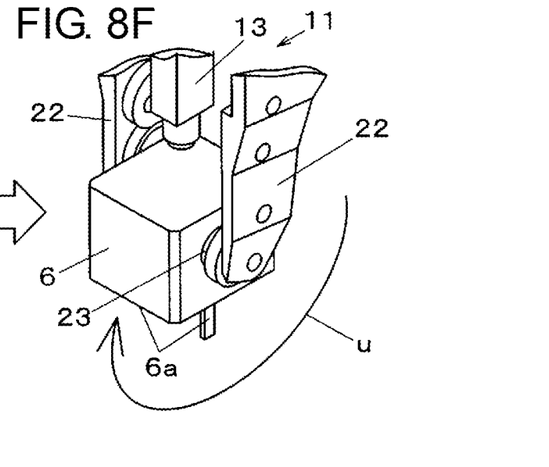

The suction and holding by nozzle 13a is released, and nozzle shaft 13 is lifted (arrow t) from component 6 that is in a state of being held by contact portions 23 as illustrated in FIG. 8E. Subsequently, contact portions 23 rotate with respect to grip members 22 by a function of the contact portion driving portion provided in component holder 11. Thus, component 6 rotates along with contact portions 23 (arrow u), and the posture of component 6 is converted from the upward posture of lead 6a to the downward posture of lead 6a as illustrated in FIG. 8F.

Figure 9A:
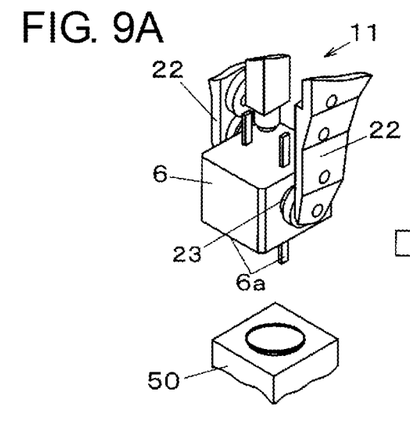
FIGS. 9A to 9E are views depicting an operation of another working method in the working apparatus of the exemplary embodiment of the disclosure.
Figure 9B:
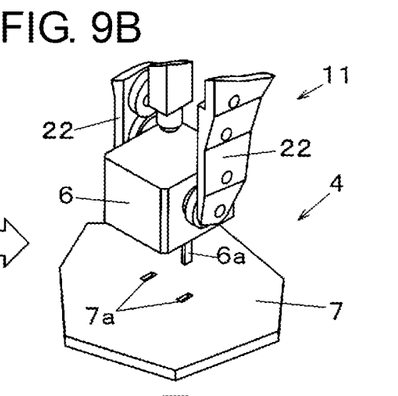

Then, working head 10 holding component 6 is caused to move from supplier 3, and is positioned above component recognition camera 50 such that component 6 is imaged from the underside and is recognized as illustrated in FIG. 9A. Thus, a position of lead 6a is detected. Subsequently, working head 10 holding component 6 after the recognition of the underside moves to board holder 4 on which board 7 is positioned. First, as illustrated in FIG. 9B, lead 6a of component 6 on the underside is aligned with mounting hole 7a of board 7.

Figure 9C:
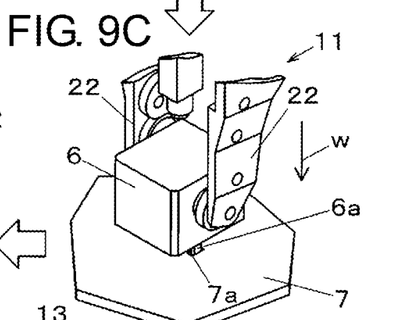
Figure 9D:
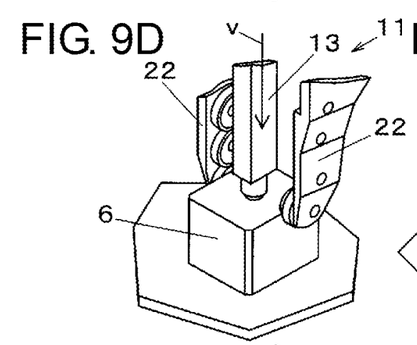

Subsequently, as illustrated in FIG. 9C, component holder 11 is lowered (arrow w), component 6 held by contact portions 23 of the pair of grip members 22 lands on board 7, and lead 6a is inserted into mounting hole 7a. Subsequently, as illustrated in FIG. 9D, in a state in which component 6 is pinched by the pair of grip members 22, nozzle shaft 13 is lowered (arrow v) to come into contact with the top surface of component 6, and component 6 is pressed against board 7. Thus, lead 6a is completely inserted into mounting hole 7a and component 6 is mounted on board 7 in a normal state.

Figure 9E:
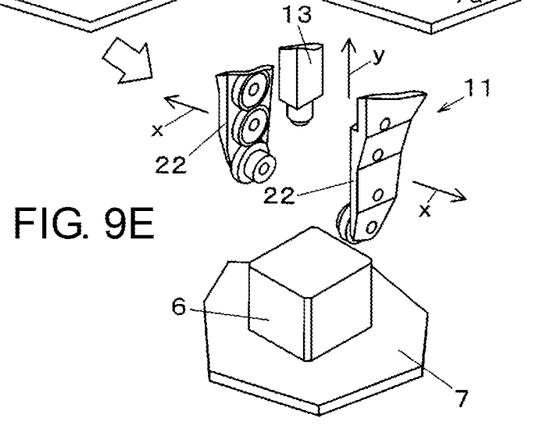

In this manner, while mounting of component 6 on board 7 is completed, as illustrated in FIG. 9E, the pair of grip members 22 in component holder 11 are caused to move in the opening direction (arrow x), and the holding of component 6 by grip members 22 is completely released. In this state, component holder 11 is lifted (arrow y). Thus, the mounting of component 6 on board 7 in working apparatus 1 is completed.

The working method described in the operation above includes a process of causing the pair of grip members 22 to enter the opening state, a process of picking up component 6 from supplier 3 and positioning the component between contact portions 23 provided on the pair of grip members 22, a process of pinching and holding component 6 by contact portions 23, a process of converting the posture of component 6 by rotating contact portions 23 with respect to grip members 22, and a process of mounting component 6 at the predetermined position of board 7 as the work.

In the operational example illustrated in FIGS. 8A to 9E, the example, in which the pair of grip members 22 enter the opening state, then, nozzle 13a picks up component 6 from supplier 3, nozzle shaft 13 is lifted, and thereby component 6 is positioned between contact portions 23 provided on the pair of grip members 22, is described; however, component 6 may be picked up in a state in which grip members 22 do not enter the opening state and without using nozzle 13a, depending on a shape or size of the component as the pick-up target.

In other words, in this case, the working method includes the process of picking up component 6 from supplier 3, the process of pinching and holding component 6 picked up by contact portions 23 provided on the pair of grip members 22, the process of converting the posture of component 6 by rotating contact portions 23 with respect to grip members 22, and the process of mounting component 6 at the predetermined position of board 7 as the work.

As described above, working apparatus 1 according to the exemplary embodiment holds component 6 by component holder 11 and mounts the component at the predetermined position of board 7 as the work. In the working apparatus 1, component holder 11 that holds component 6 is configured to include the pair of grip members 22 that pinch and grip component 6, the grip member opening/closing portion that opens and closes the pair of grip members 22, the pair of contact portions 23 that are disposed on the pair of grip members 22 and freely rotate around rotary shaft 23a provided in the opening/closing direction of grip members 22, and a contact portion driving portion that causes contact portion 23 to rotate around rotary shaft 23a. Thus, it is possible to convert the posture of component 6 by component holder 11 and to efficiently mount the component on board 7.

A working apparatus and a working method of the disclosure achieve an effect that it is possible to convert a posture of a component by a component holder and to efficiently mount the component on a work, and are applicable to a working field in which a component is mounted at a predetermined position of a work.

What is claimed is:

1. A working apparatus comprising:
a component holder that holds a component and mounts the component at a predetermined position of a work, wherein the component holder includes
a pair of grip members,
a grip member opening/closing portion that opens and closes the pair of grip members,
a pair of contact portions that are disposed on the pair of grip members to pinch the component between the pair of contact portions and freely rotate around rotary shafts provided in an opening/closing direction of the pair of grip members, and
a contact portion driving portion that causes the contact portions to rotate around the rotary shafts to convert a posture of the component pinched between the pair of contact portions, the contact portion driving portion comprising a shaft with drive rollers, input rollers provided on each of the grip members and engaged with the drive rollers, and intermediate rollers disposed on each of the grip members and engaged with the input rollers and the pair of contact portions such that when the shaft is rotated, the drive rollers transmit rotational motion to the input rollers, which thereby transmit rotational motion to the intermediate rollers, which thereby transmit rotational motion to the pair of contact portions to rotate around the rotary shafts.

2. The working apparatus of claim 1,
wherein the pair of grip members each has a base and a front end portion extending from the base,
wherein the contact portions are mounted to freely rotate with respect to the front end portions, and
wherein the contact portion driving portion includes
a drive source that drives the shaft to transmit rotational motion from the drive rollers to the input rollers which are disposed in the bases.

3. The working apparatus of claim 1, further comprising:
a component pick-up portion that carries the component pinched between the pair of grip members.

4. The working apparatus of claim 3,
wherein the component pick-up portion is lifted and lowered between the pair of grip members.

5. The working apparatus of claim 4, wherein the component pick-up portion is a nozzle that performs holding of the component by a suction force.

6. The working apparatus of claim 3, wherein the component pick-up portion functions as a pusher that pushes the component held between the pair of contact portions to the work.

7. The working apparatus of claim 1, further comprising:
a pusher that pushes the component gripped by the pair of grip members to the work.

8. A working method in which a component holder holds a component and mounts the component at a predetermined position of a work,
the working method comprising:
causing a pair of grip members to be in an opening state;
picking up the component from a supplier and positioning the component between contact portions provided in the pair of grip members;
pinching and holding the component by the contact portions by causing the pair of grip members to close;
causing the contact portions to rotate with respect to the pair of grip members by using a contact portion driving portion for converting a posture of the component held by the contact portions, the contact portion driving portion comprising a shaft with drive rollers, input rollers provided on each of the grip members and engaged with the drive rollers, and intermediate rollers disposed on each of the grip members and engaged with the input rollers and the pair of contact portions such that when the shaft is rotated, the drive rollers transmit rotational motion to the input rollers which thereby transmit rotational motion to the intermediate rollers which thereby transmit rotational motion to the pair of contact portions to rotate around the rotary shafts; and
mounting the component held by the contact portions at the predetermined position of the work.

9. A working method in which a component holder holds a component and mounts the component at a predetermined position of a work,
the working method comprising:
picking up the component from a supplier;
pinching and holding the component picked up by contact portions provided in a pair of grip members by causing the pair of grip members to close about the component;
causing the contact portions to rotate with respect to the pair of grip members by using a contact portion driving portion for converting a posture of the component, the contact portion driving portion comprising a shaft with drive rollers, input rollers provided on each of the grip members and engaged with the drive rollers, and intermediate rollers disposed on each of the grip members and engaged with the input rollers and the pair of contact portions such that when the shaft is rotated, the drive rollers transmit rotational motion to the input rollers which thereby transmit rotational motion to the intermediate rollers which thereby transmit rotational motion to the pair of contact portions to rotate around the rotary shafts; and
mounting the component held by the contact portions at the predetermined position of the work.

* * * * *